United States Patent [19]
O'Donnell

[11] Patent Number: 5,994,235
[45] Date of Patent: Nov. 30, 1999

[54] METHODS FOR ETCHING AN ALUMINUM-CONTAINING LAYER

[75] Inventor: Robert J. O'Donnell, San Francisco, Calif.

[73] Assignee: Lam Research Corporation, Fremont, Calif.

[21] Appl. No.: 09/103,498

[22] Filed: Jun. 24, 1998

[51] Int. Cl.$^6$ .................................................. H01L 21/00
[52] U.S. Cl. .............................. 438/720; 438/742; 216/77
[58] Field of Search .............................. 216/77; 438/720, 438/742

[56] References Cited

U.S. PATENT DOCUMENTS

| | | | |
|---|---|---|---|
| 4,148,705 | 4/1979 | Battey et al. | 204/192 E |
| 4,511,429 | 4/1985 | Mizutani et al. | 156/643 |
| 5,843,848 | 12/1998 | Yanagawa | 438/738 |

OTHER PUBLICATIONS

Toshinobu Banjo, et al., "Effects of $O_2$ Addition on $BCl_3/Cl_2$ Plasma Chemistry for Al Etching", Jpn. J. Appl. Phys. Vol. 36 pp. 4824–4828. Jul. 1997.

*Primary Examiner*—William Krynski
*Assistant Examiner*—Chris Cronin
*Attorney, Agent, or Firm*—Beyer & Weaver, LLP

[57] ABSTRACT

A method for etching selected portions of an aluminum-containing layer of a layer stack that is disposed on a substrate. The aluminum-containing layer is disposed below a photoresist mask having a pattern thereon. The method includes providing a plasma processing chamber and positioning the substrate having thereon the layer stack, including the aluminum containing layer and the photoresist mask, within the plasma processing chamber. The method further includes flowing an etchant source gas that comprises HCl, a chlorine-containing source gas, and an oxygen-containing source gas into the plasma processing chamber. The flow rate of the oxygen-containing source gas is less than about 20 percent of a total flow rate of the etchant source gas. There is also included striking a plasma out of the etchant source gas, wherein the plasma is employed to etch at least partially through the aluminum-containing layer.

26 Claims, 4 Drawing Sheets

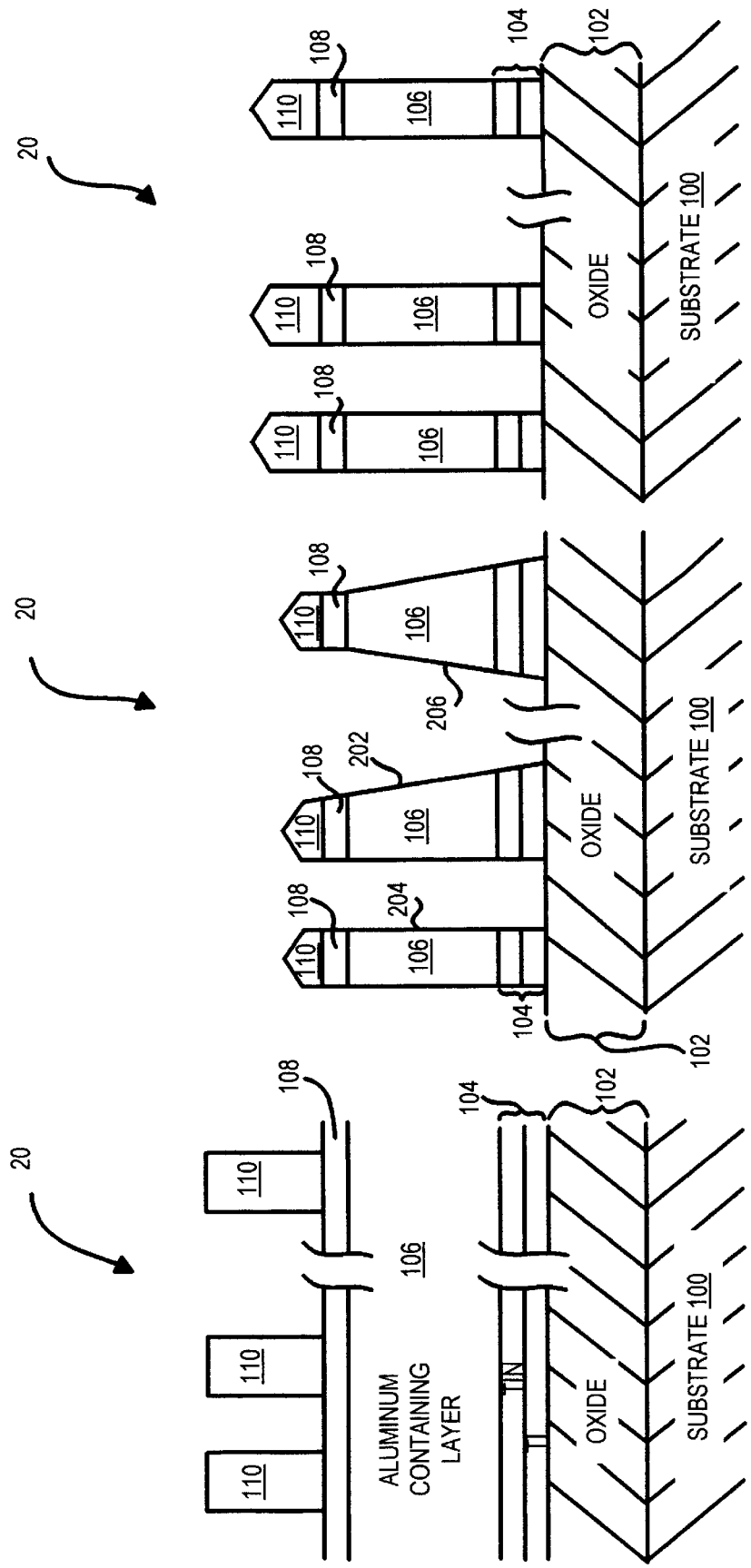

METHODS FOR ETCHING AN ALUMINUM-CONTAINING LAYER

BACKGROUND OF THE INVENTION

The present invention relates to the processing of semiconductor substrates. More particularly, the present invention relates to methods for improving etch results while etching through an aluminum-containing layer.

In semiconductor processing, devices such as component transistors may be formed on a semiconductor wafer or substrate, which is typically made of silicon. Metallic interconnect lines, which are typically etched from an aluminum-containing layer disposed above the substrate, may then be employed to couple the devices together to form the desired circuit.

To facilitate discussion, FIG. 1 illustrates a cross-section view of a layer stack 20, representing some of the layers formed during the fabrication of a typical semiconductor integrated circuit. Although a semiconductor integrated circuit (IC) is discussed herein to facilitate ease of understanding, the discussion herein also pertains to substrates employed to fabricate other electronic components, e.g., glass panels employed to fabricate flat panel displays. It should be noted that other additional layers above, below, or between the layers shown may be present. Further, not all of the shown layers need necessarily be present and some or all may be substituted by other different layers.

At the bottom of layer stack 20, there is shown a substrate 100. An oxide layer 102, typically comprising $SiO_2$, may be formed above substrate 100. A barrier layer 104, typically formed of a titanium-containing layer such as Ti, TiW, TiN or other suitable barrier materials, may be disposed between oxide layer 102 and a subsequently deposited metallization layer 106. In the case of FIG. 1, barrier layer 104 represents a two-layer structure, which includes a Ti layer underlying a TiN layer. Barrier layer 104, when provided, functions to prevent the diffusion of silicon atoms from oxide layer 102 into the aluminum-containing layer.

Aluminum-containing layer 106 may represent a layer of pure aluminum or may represent a layer formed of one of the known aluminum alloys such as Al—Cu, Al—Si, or Al—Cu—Si. The remaining two layers of FIG. 1, i.e., an anti-reflective coating (ARC) layer 108 and an overlying photoresist (PR) layer 110, may then be formed atop aluminum-containing layer 106. The ARC layer 108, typically comprising another titanium-containing layer such as TiN or TiW, may help prevent light (e.g., from the lithography step that patterns the photoresist) from being reflected and scattered off the surface of the aluminum-containing layer 106.

Photoresist layer 110 represents a layer of conventional photoresist material, which may be patterned for etching, e.g., through exposure to ultraviolet rays. As will be apparent, the layers of particular interest to the present invention are aluminum-containing layer 106 and photoresist layer 110, with all other layers being optional. The layers of layer stack 20 are readily recognizable to those skilled in the art and may be formed using any of a number of suitable and known deposition processes, including chemical vapor deposition (CVD), plasma-enhanced chemical vapor deposition (PECVD), and physical vapor deposition (PVD) such as sputtering.

To form the aforementioned metallic interconnect lines, a portion of the layers of the layer stack, including aluminum-containing layer 106, may be etched using a suitable photoresist technique. By way of example, one such photoresist technique involves the patterning of photoresist layer 110 by exposing the photoresist material in a contact or stepper lithography system, and the development of the photoresist material to form a mask to facilitate subsequent etching. Using an appropriate etchant, the areas of the aluminum-containing layer that are unprotected by the mask may then be etched away using an appropriate etching source gas, leaving behind aluminum-containing interconnect lines or features. By way of example, a commonly employed etchant for plasma etching the aluminum layer is a mixture of $Cl_2$ and $BCl_3$.

To achieve greater circuit density, modern semiconductor devices are scaled with increasingly narrower etch geometries. As a result, the feature sizes, i.e., the width of the interconnect lines or the spacings (e.g., trenches) between adjacent interconnect lines, have steadily decreased. By way of example, while a line width of approximately 0.8 microns ($\mu$m) is considered acceptable in a 4 megabit (Mb) dynamic random access memory (DRAM) IC, 256 Mb DRAM IC's preferably employ interconnect lines as thin as 0.25 microns or even thinner.

The ever shrinking etch geometries however present many challenges to process engineers. As features become smaller and the photoresist mask becomes progressively thinner, it becomes increasingly important to come up with etch processes that can yield satisfactory etch results. This is because the etch results from the prior art $Cl_2/BCl_3$ etch process tend to degrade when the feature size decreases below a certain point.

By way of example, photoresist selectivity is an etch result that process engineers constantly strive to improve. Photoresist selectivity refers to the ability of a given etch process to discriminate between the target layer to be etched (the aluminum-containing layer in this case) and the photoresist mask. Photoresist selectivity is frequently expressed in terms of the etch rate through the target layer versus the etch rate of the photoresist mask. Photoresist selectivity is quite important since the photoresist mask employed in the fabrication of modern semiconductor devices is quite thin. If a chosen etch process has too low a photoresist selectivity, the photoresist mask may be worn away before the etch is completed, causing etch damage to occur in regions of the underlying aluminum-containing layer where no etching is intended.

Micromasking residue is another important etch result that needs attention. In general, it is desirable that the chosen etch process does not leave unwanted residues or etch byproducts on the surface of the substrate after etching. This is because the presence of the unwanted residue may interfere with subsequent processing steps and/or with the proper performance of the resultant semiconductor device. Another important etch parameter is the etch rate through the aluminum-containing layer. Since a higher aluminum etch rate is advantageous from a cost of ownership standpoint (i.e., the production cost per substrate), a higher aluminum etch rate is generally desirable.

Still another important etch result is the profile microloading. Profile microloading occurs because the etching that occurs in the narrow spacings may differ from one that occurs in the open field regions. This difference may cause the sidewall profile of features in the dense region to assume a different shape from the sidewall profile of features in the open field region. With reference to FIG. 2, for example, it is seen therein that profile microloading causes a sidewall 202 and a sidewall 206 in the open field region to assume a more tapered profile than the more vertical sidewall 204 in the dense region. In this example, FIG. 2 represents the result after the layer stack of FIG. 1 has been etched with the prior art $Cl_2/BCl_3$ etchant source gas in a plasma processing chamber. Because profile microloading represents an aberration in the critical dimension of the etched features, it is generally desirable to minimize profile microloading. These and other etch results are representative of the etch results that process engineers constantly strive to optimize to meet the challenge of fabricating modern highly dense semiconductor devices.

SUMMARY OF THE INVENTION

The invention relates, in one embodiment, to a method for etching selected portions of an aluminum-containing layer of a layer stack that is disposed on a substrate. The aluminum-containing layer is disposed below a photoresist mask having a pattern thereon. The method includes providing a plasma processing chamber and positioning the substrate having thereon the layer stack, including the aluminum containing layer and the photoresist mask, within the plasma processing chamber. The method further includes flowing an etchant source gas that comprises HCl, a chlorine-containing source gas, and an oxygen-containing source gas into the plasma processing chamber. The flow rate of the oxygen-containing source gas is less than about 20 percent of a total flow rate of the etchant source gas. There is also included striking a plasma out of the etchant source gas, wherein the plasma is employed to etch at least partially through the aluminum-containing layer.

In another embodiment, the invention relates to a method for etching selected portions of an aluminum-containing layer of a layer stack that is disposed on a substrate. The aluminum-containing layer is disposed below a photoresist mask having a pattern thereon. The method includes providing a plasma processing chamber configured to form a high density plasma through inductive coupling action. The method also includes positioning the substrate having thereon the layer stack, including the aluminum containing layer and the photoresist mask, within the plasma processing chamber. There is also included flowing an etchant source gas that comprises HCl, $Cl_2$, and $O_2$ into the plasma processing chamber, a flow rate of the $O_2$ being less than about 20 percent of a total flow rate of the etchant source gas. There is further included striking a plasma out of the etchant source gas, wherein the plasma is employed to etch at least partially through the aluminum-containing layer. Additionally, there is included maintaining a pressure of between about 2 mTorr and about 20 mTorr in the plasma processing chamber while the aluminum-containing layer is etched.

In yet another embodiment, the invention relates to a method for improving photoresist selectivity while etching selected portions of an aluminum-containing layer of a layer stack that is disposed on a substrate. The aluminum-containing layer is disposed below a photoresist mask having a pattern thereon. The etching is performed in a plasma processing chamber. The method includes flowing an etchant source gas that comprises HCl, $Cl_2$, and $O_2$ into the plasma processing chamber. A flow rate of the $O_2$ being less than about 20 percent of a total flow rate of the etchant source gas. The method further includes striking a plasma out of the etchant source gas, wherein the plasma is employed to etch at least partially through the aluminum-containing layer. Additionally, there is included maintaining a pressure of between about 2 mTorr and about 20 mTorr in the plasma processing chamber while the aluminum-containing layer is etched.

These and other advantages of the present invention will become apparent upon reading the following detailed descriptions and studying the various figures of the drawings.

BRIEF DESCRIPTION OF THE DRAWINGS

The present invention is illustrated by way of example, and not by way of limitation, in the figures of the accompanying drawings which are not drawn to scale to simplify the illustration and in which like reference numerals refer to similar elements.

FIG. 1 illustrates a cross-section view of a layer stack, representing the layers formed during the fabrication of a typical semiconductor IC.

FIG. 2 illustrates a cross-section view of the layer stack of FIG. 1 after the aluminum-containing layer is etched using a $Cl_2/BCl_3$ chemistry.

FIG. 3 illustrates a cross-section view of the layer stack of FIG. 1 after the aluminum-containing layer is etched using the inventive chemistry that includes HCl, a chlorine-containing source gas, and an oxygen-containing source gas.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

In accordance with one aspect of the invention, the etch through the aluminum-containing layer is optimized by etching the substrate in a plasma processing chamber using an etchant source gas that includes HCl, a chlorine-containing source gas, and an oxygen-containing source gas. As the term is used herein, the chlorine-containing source gas represents any chlorine-containing gas such as, for example, $Cl_2$, $CCl_4$, or the like (but not HCl). The oxygen-containing source gas may include CO, $CO_2$, $NO_x$, $O_2$, or the like (either alone or in combination with a diluent such as $N_2$, Ar, or preferably He, or the like). In one preferred embodiment, the etchant source gas employed includes HCl, $Cl_2$, and $O_2$, with the $O_2$ flow being limited to below about 20% of the total gas flow into the plasma processing chamber. In the disclosed regime of etch parameters, it has been found that in the presence of exposed aluminum, the addition of the $O_2$ gas surprisingly reduces the photoresist etch rate.

The reduction of the photoresist etch rate is said to be surprising since the photoresist mask is typically organic-based, and the addition of an oxygen-containing gas that dissociates and forms oxygen plasma should therefore accelerate the burning or removal of the photoresist. In fact, oxygen is widely employed in the prior art as one of the source gases employed in downstream photoresist stripping processes, i.e., the processes designed to quickly etch away the photoresist mask. Thus, one skilled in the art would not at all expect that the addition of an oxygen-containing gas would actually reduce the photoresist etch rate.

Figure 4A:
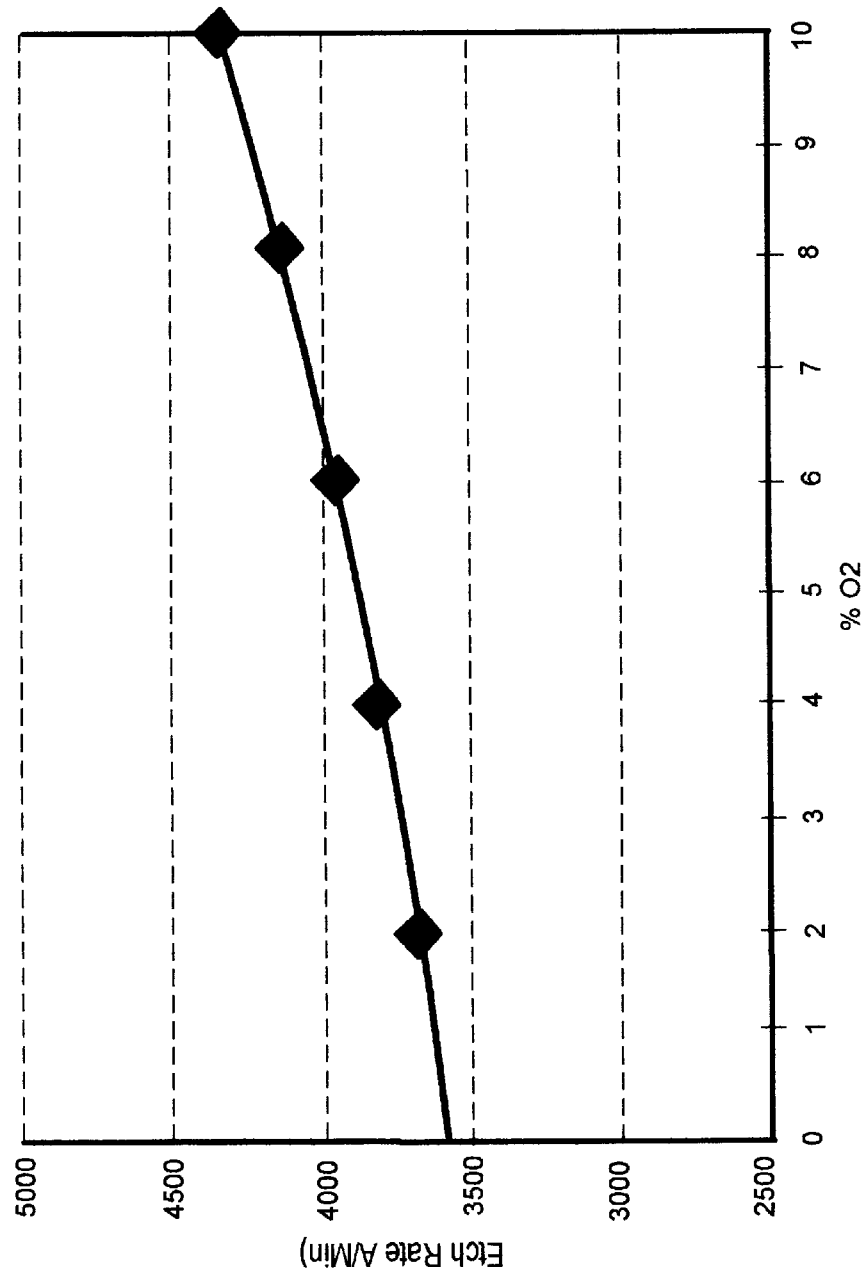
FIG. 4A is a graph illustrating the relationship between the photoresist etch rate and the flow rate of oxygen (expressed as a percentage of the total flow rate of the $HCl/Cl_2/O_2$ mixture) when no aluminum is present.
Figure 4B:
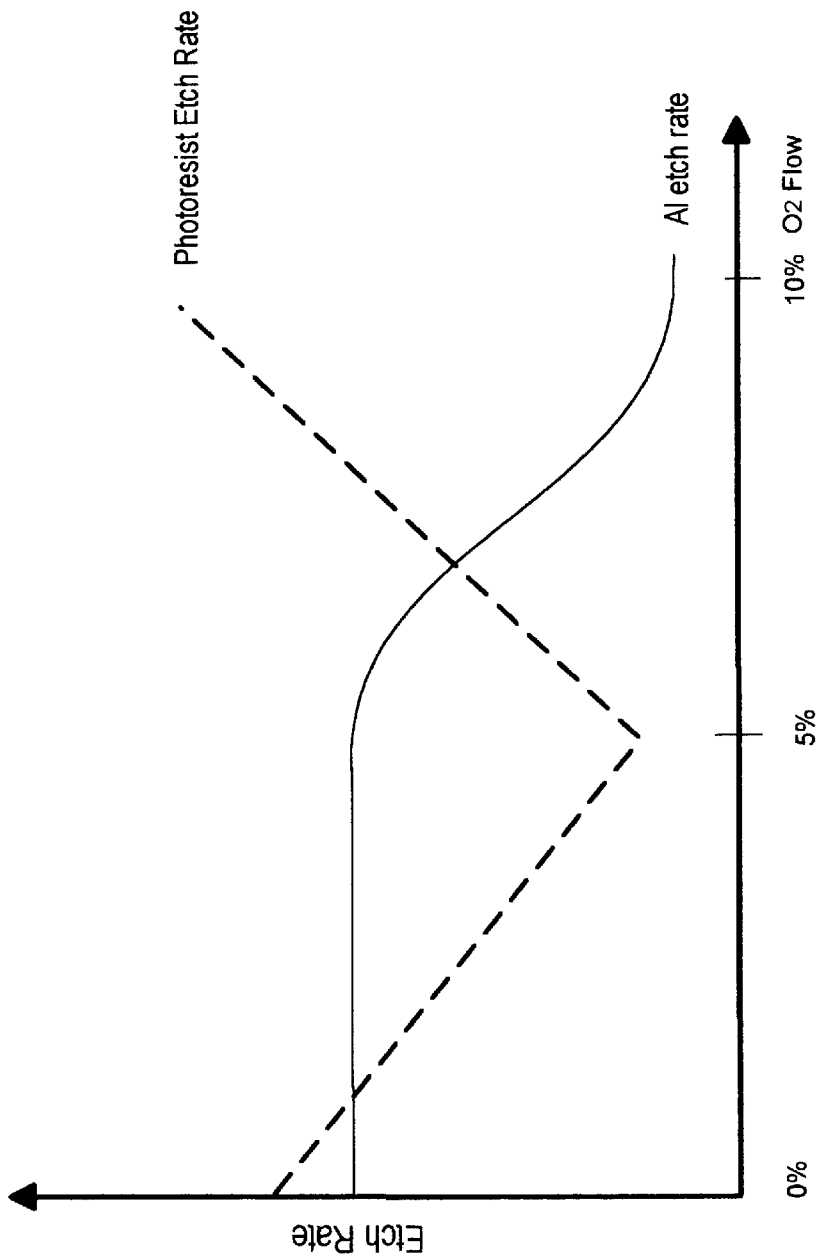
FIG. 4B is a graph illustrating the relationship between the aluminum etch rate, the photoresist etch rate and the flow rate of oxygen (expressed as a percentage of the total flow rate of the $HCl/Cl_2/O_2$ mixture) when the aluminum layer is etched.

The inventor has also confirmed that when a test wafer that is blanket deposited with only photoresist (i.e., without an underlying aluminum-containing layer), the addition of $O_2$ into the HCl/$Cl_2$ mixture does indeed accelerate the photoresist etch rate. This expected result is shown in FIG. 4 wherein the photoresist etch rate on a test wafer having thereon only a layer of blanket deposited I-line photoresist is shown relative to the flow rate of oxygen (expressed as a percentage of the total flow rate of the HCl/$Cl_2$/$O_2$ mixture). As can be seen in FIG. 4A, increasing the oxygen flow rate increases the photoresist etch rate in this situation.

However, experimental data shows that given the disclosed process conditions as a whole, increasing the flow rate of the $O_2$ gas in the inventive and disclosed etch regime actually helps decrease the photoresist etch rate when the aluminum-containing layer is the target layer to be etched. This can be seen in the plot of FIG. 4B wherein the aluminum etch rate and the photoresist etch rate are plotted for one exemplary etch employing the inventive HCl/$Cl_2$/$O_2$ recipe. For the example of FIG. 4B, the aluminum etch rate and the photoresist etch rate behave as expected when the oxygen flow rate is above a break point (about 5% of the total flow volume in the example of FIG. 4B). That is, the aluminum etch rate decreases (due to the formation of relatively stable $Al_2O_3$) and the photoresist etch rate increases with increasing oxygen flow. Curiously, the aluminum etch rate and the photoresist etch rate behave in a totally unexpected manner when the oxygen flow is below the break point (about 5% of total flow volume in the example of FIG. 4B). That is, in the regime wherein the oxygen flow rate is below the break point, the aluminum etch rate does not decrease while the photoresist etch rate actually decreases.

In accordance with another aspect of the present invention, it is preferable, although not absolutely necessary, that the etchant source gas be substantially free of $BCl_3$. In other words, good etch results in terms of the aluminum etch rate, photoresist selectivity, profile microloading, micro-masking residue, and the like, have been achieved with the addition of $O_2$ using the disclosed etch regime and in the absence of $BCl_3$. This is so even though $BCl_3$ is not present to passivate the etch features, as in the case of the prior art $Cl_2$/$BCl_3$ etch.

The absence of aluminum oxide residue is also another surprising finding of the inventive etch process. In general, aluminum oxide is a very stable compound. Outside of the semiconductor area, it is widely known that aluminum oxide allows aluminum components to be highly resistant to corrosion damage since the durable coating of aluminum oxide, which is formed when aluminum reacts with oxygen in the ambient environment, coats the aluminum surface and stops any further corrosion. Since an oxygen-containing source gas is introduced into the etch source gas mix, one would expect that aluminum oxide, which is also relatively nonvolatile, would be formed and there would be aluminum oxide residue on the wafer surface after etching. Nevertheless, in the etch regime disclosed herein, there is surprisingly little, if any, residue formed on the substrate surface after etching.

While it is not completely understood why the photoresist etch rate would increase in the absence of aluminum and decreases when aluminum is present, the inventor herein speculates that the surprising absence of aluminum oxide residues may be explained by the relatively low flow of the oxygen-containing source gas (which limits the rate of formation of any aluminum oxide residue) as well as the appropriate setting of the chuck electrode bias (which controls the rate at which the substrate surface is bombarded during etching). By striking a careful balance between the rate of aluminum oxide (as well as other residue) formation and the rate at which the residues is sputtered off the substrate surface, a substantially residue-free etch result may be obtained.

In fact, it is believed that the flow rate of the oxygen-containing source gas plays a crucial role in the success of the aluminum etch. To avoid the presence of residue after etching, the flow rate of the oxygen-containing source gas is preferably below about 20% (but not at 0%) of the total etchant source gas flow rate, more preferably below about 10% (but not at 0%) and most preferably between about 2% and about 4%.

Figure 5:
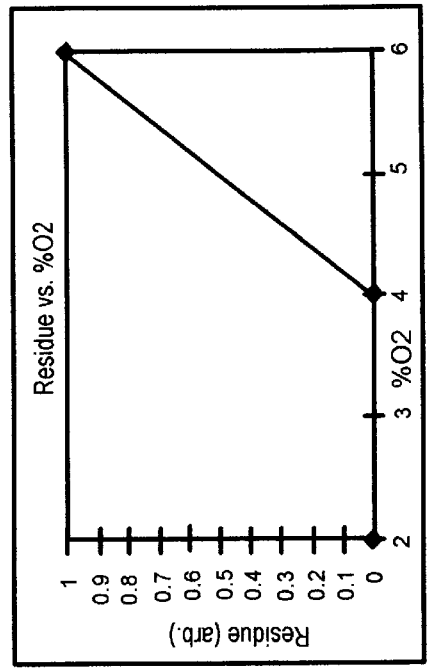
FIG. 5 is a graph illustrating the relationship between the residue and the flow rate of oxygen (expressed as a percentage of the total flow rate of the $HCl/Cl_2/O_2$ mixture) while etching through an aluminum-containing layer for one exemplary etch employing the inventive disclosed etch regime.
Figure 6:
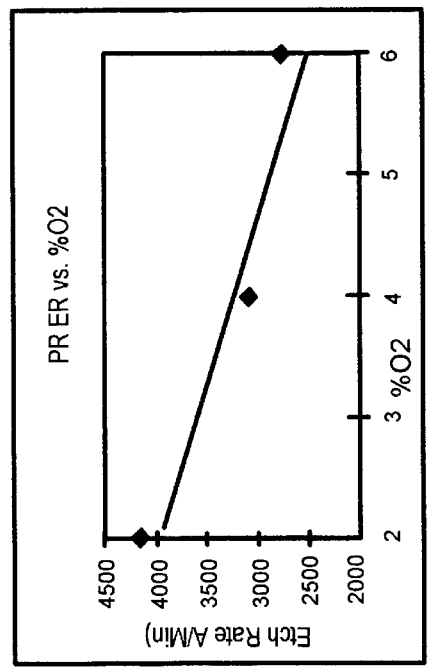
FIG. 6 is a graph illustrating the relationship between the photoresist etch rate and the flow rate of oxygen (expressed as a percentage of the total flow rate of the $HCl/Cl_2/O_2$ mixture) while etching through an aluminum-containing layer for one exemplary etch employing the inventive disclosed etch regime.

FIGS. 5–8 illustrate some of the etch results for an exemplary etch wherein a mixture of HCl/$Cl_2$, and $O_2$ is employed as the etchant source gas in an inductively coupled, low pressure, high density plasma processing chamber. FIG. 5 depicts the relationship between residue remaining (shown in an arbitrary scale on the y axis) and the flow rate of oxygen (expressed as a percentage of the total flow rate on the x axis) for one exemplary recipe. As can be seen, the residue increases significantly when the flow rate of oxygen increases. Below a certain flow rate (4% in the example of FIG. 5), the residue is however surprisingly absent. FIG. 6 depicts the relationship between the photoresist etch rate (in angstroms per minute) and the flow rate of oxygen (again expressed as a percentage of the total flow rate). As can be seen in the example of FIG. 6, the photoresist etch rate surprisingly decreases as the oxygen flow rate increases in the regime shown (e.g., between about 2% and about 6% in the example of FIG. 6).

Figure 7:
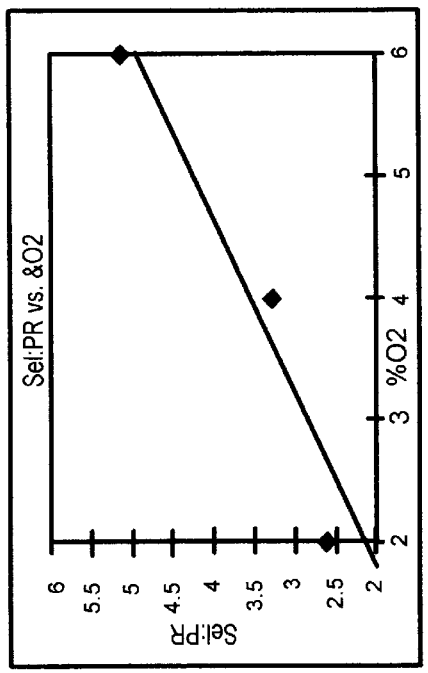
FIG. 7 is a graph illustrating the relationship between the photoresist selectivity and the flow rate of oxygen (expressed as a percentage of the total flow rate of the $HCl/Cl_2/O_2$ mixture) while etching through an aluminum-containing layer for one exemplary etch employing the inventive disclosed etch regime.

FIG. 7 depicts the relationship between the photoresist selectivity (i.e., aluminum etch rate relative to photoresist etch rate) and the flow rate of oxygen (again expressed as a percentage of the total flow rate). As the example of FIG. 7 shows, the photoresist selectivity increases as the flow rate of oxygen is increased in the exemplary regime of the figure (i.e., between about 2% and about 6%).

Figure 8:
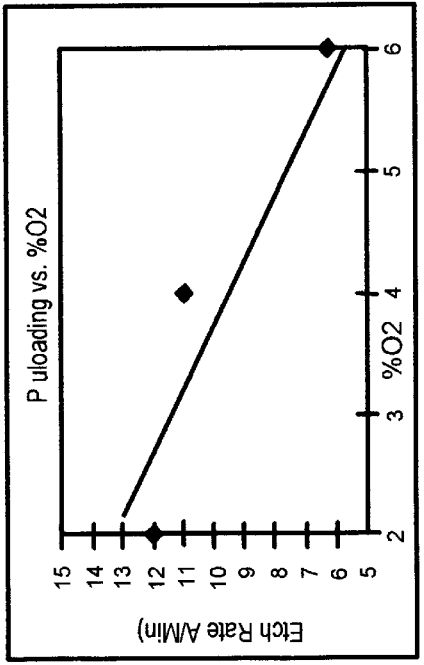
FIG. 8 is a graph illustrating the relationship between the profile microloading and the flow rate of oxygen (expressed as a percentage of the total flow rate of the $HCl/Cl_2/O_2$ mixture) while etching through an aluminum-containing layer for one exemplary etch employing the inventive disclosed etch regime.

FIG. 8 depicts the relationship between the profile microloading and the flow rate of oxygen (again expressed as a percentage of the total flow rate). As the example of FIG. 8 shows, the profile microloading decreases as the flow rate of oxygen is increased in the exemplary regime of the figure (i.e., between about 2% and about 6%). Decreasing profile microloading in the disclosed etch regime is another advantage of the inventive etch process.

In one exemplary etch, a 200 mm wafer having thereon an aluminum layer underlying a deep UV photoresist mask, which is about 8,000 angstrom thick, is etched in a high density, low pressure inductively coupled plasma processing chamber known as the 9600PIX, available from Lam Research Corp. of Fremont, Calif. As the terms are employed herein, high density refers to a plasma density above about $10^{11}$ ions/cm$^3$ while low pressure refers to the fact that the pressure within the plasma chamber is below about 100 mTorr during etching. The invention is of course not limited to any particular type of photoresist material or wafer size, and it is contemplated that the invention may well be practiced in other types of plasma processing reactors, including those having higher pressures and medium or low density plasma.

In the aforementioned 9600 PTX plasma processing system, the bottom electrode power may be between about 80 watts and about 300 watts, more preferably between about 100 watts and about 220 watts, and preferably at about 160 watts. The bottom electrode power is a critical parameter because it controls the rate of residue sputtering, as mentioned earlier. It is contemplated that this value, as well as other values disclosed herein, may be optimized to suit the requirements of a particular plasma processing system, a particular substrate size, or a particular type of photoresist and/or aluminum-containing layer. Such optimization is within the ability of one of ordinary skills in the art given this disclosure.

The top electrode power may be between about 400 watts and about 1,200 watts, more preferably between about 600 watts and about 1,000 watts, and preferably at about 800 watts. The pressure in the plasma chamber during etching may be between about 2 mTorr and about 20 mTorr, more preferably between about 8 mTorr and about 12 mTorr, and preferably at about 10 mTorr. The pressure is a critical parameter since it impacts the residence time of the plasma.

The total flow rate of the HCl/chlorine-containing source gas/oxygen containing source gas (e.g., HCL/Cl$_2$/O$_2$) etchant source gas may be between about 50 standard cubic centimeters per minute (sccm) and about 300 sccm, more preferably between about 100 sccm and about 200 sccm, and preferably at about 150 sccm. The ratio of the chlorine-containing source gas (e.g., Cl$_2$) to HCl may be between about 0.1:1 and about 10:1, more preferably between about 0.25:1 and about 4:1, and preferably at about 2:1. The flow rate of the oxygen-containing gas (e.g., O$_2$) as a percentage of the total flow rate may be between about 0% (but not at 0%) and about 20%, more preferably between about 0% (but not at 0%) and about 10%, and even more preferably between about 2% and about 4%. As mentioned earlier, the oxygen flow rate is a critical parameter since it produces the surprising result of lowering the photoresist etch rate and forming surprisingly little, if any, residue in the disclosed etch regime. The electrode temperature may be between about 20° C. and about 80° C., more preferably between about 40° C. and about 60° C., and preferably at about 50° C.

In Table 1 below, some exemplary etch results for an aluminum etch using the HCl/Cl$_2$/O$_2$ chemistry are shown. For comparison purposes, the etch results obtained using similar process parameters but employing Cl$_2$/BCl3 as the etchant source gas is also shown. Both processes have been adjusted so that substantially no residue remains after etching.

TABLE 1

| PROCESS | Cl$_2$/BCl$_3$ | HCl/Cl$_2$/O$_2$ |
| --- | --- | --- |
| Aluminum Etch Rate in Angstroms Per Minute | about 14,000 | about 18,000 |
| Photoresist Etch Rate in Angstroms Per Minute (For I-line photoresist) | about 4,400 | about 3,200 |
| Photoresist Selectivity | 3.1:1 | 5.6:1 |
| Profile Microloading | 15% | 7% |

While this invention has been described in terms of several preferred embodiments, there are alterations, permutations, and equivalents which fall within the scope of this invention. For example, although it is discussed in the disclosure that O$_2$ is the oxygen-containing gas in the disclosed recipe, it is possible, and in fact common, to add a diluent such as He into the O$_2$ gas flow. Such a mixture or a similar mixture is within the scope of this invention. As a further example, although the examples are given with reference to an inductively coupled plasma processing system, it is expected that the inventive etch technique also applies in other types of plasma processing systems (e.g., those that are ECR-based, MORI-based, or diode-based). It should also be noted that there are many alternative ways of implementing the methods and apparatuses of the present invention. It is therefore intended that the following appended claims be interpreted as including all such alterations, permutations, and equivalents as fall within the true spirit and scope of the present invention.

What is claimed is:

1. A method for etching selected portions of an aluminum-containing layer of a layer stack, said layer stack being disposed on a substrate, said aluminum-containing layer being disposed below a photoresist mask having a pattern thereon, comprising:

providing a plasma processing chamber;

positioning said substrate having thereon said layer stack, including said aluminum containing layer and said photoresist mask, within said plasma processing chamber;

flowing an etchant source gas that comprises HCl, a chlorine-containing source gas wherein said chlorine-containing source gas is substantially free of BCl$_3$, and an oxygen-containing source gas into said plasma processing chamber, a flow rate of said oxygen-containing source gas being less than about 20 percent of a total flow rate of said etchant source gas;

striking a plasma out of said etchant source gas, wherein said plasma is employed to etch at least partially through said aluminum-containing layer.

2. The method of claim 1 wherein said oxygen-containing source gas is O$_2$.

3. The method of claim 2 wherein said chlorine-containing source gas is Cl$_2$.

4. The method of claim 2 wherein said flow rate of said oxygen-containing source gas is less than about 10 percent of said total flow rate.

5. The method of claim 4 wherein said plasma processing chamber represents an inductively coupled plasma processing chamber.

6. The method of claim 5 wherein said plasma processing chamber further represents a low pressure, high density plasma processing chamber.

7. The method of claim 6 wherein said flow rate of said oxygen-containing source gas is between about 2 percent and about 4 percent of said total flow rate.

8. The method of claim 7 wherein said etchant source gas is substantially free of $BCl_3$.

9. The method of claim 1 wherein said oxygen-containing source gas represents a mixture of $O_2$ and He.

10. A method for etching selected portions of an aluminum-containing layer of a layer stack, said layer stack being disposed on a substrate, said aluminum-containing layer being disposed below a photoresist mask having a pattern thereon, comprising:

providing a plasma processing chamber, said plasma processing chamber being configured to form a high density plasma through inductive coupling action;

positioning said substrate having thereon said layer stack, including said aluminum containing layer and said photoresist mask, within said plasma processing chamber;

flowing an etchant source gas that comprises HCl, $Cl_2$, and $O_2$ into said plasma processing chamber, a flow rate of said $O_2$ being less than about 20 percent of a total flow rate of said etchant source gas;

striking a plasma out of said etchant source gas, wherein said plasma is employed to etch at least partially through said aluminum-containing layer; and maintaining a pressure of between about 2 mTorr and about 20 mTorr in said plasma processing chamber while said aluminum-containing layer is etched.

11. The method of claim 10 wherein said etchant source gas is substantially free of $BCl_3$.

12. The method of claim 11 wherein said flow rate of said $O_2$ is less than about 10 percent of said total flow rate.

13. The method of claim 11 wherein said flow rate of said $O_2$ is between about 2 percent and about 4 percent of said total flow rate.

14. The method of claim 13 wherein said pressure is between about 8 mTorr and about 12 mTorr.

15. A method for improving photoresist selectivity while etching selected portions of an aluminum-containing layer of a layer stack, said layer stack being disposed on a substrate, said aluminum-containing layer being disposed below a photoresist mask having a pattern thereon, said etching being performed in a plasma processing chamber, comprising:

flowing an etchant source gas that comprises HCl, $Cl_2$, and $O_2$ into said plasma processing chamber, a flow rate of said $O_2$ being less than about 20 percent of a total flow rate of said etchant source gas;

striking a plasma out of said etchant source gas, wherein said plasma is employed to etch at least partially through said aluminum-containing layer; and maintaining a pressure of between about 2 mTorr and about 20 mTorr in said plasma processing chamber while said aluminum-containing layer is etched.

16. The method of claim 15 wherein said etchant source gas is substantially free of $BCl_3$.

17. The method of claim 16 wherein said flow rate of said $O_2$ is less than about 10 percent of said total flow rate.

18. The method of claim 16 wherein said flow rate of said $O_2$ is between about 2 percent and about 4 percent of said total flow rate.

19. The method of claim 18 wherein said plasma has a density of at least $10^{11}$ ions/cm$^3$.

20. A method for etching selected portions of an aluminum-containing layer of a layer stack, said layer stack being disposed on a substrate, said aluminum-containing layer being disposed below a photoresist mask having a pattern thereon, comprising:

providing a plasma processing chamber;

positioning said substrate having thereon said layer stack, including said aluminum containing layer and said photoresist mask, within said plasma processing chamber;

flowing an etchant source gas that comprises HCl, a chlorine-containing source gas wherein said chlorine-containing source gas is substantially free of $BCl_3$, and an oxygen-containing source gas into said plasma processing chamber;

striking a plasma out of said etchant source gas, wherein said plasma is employed to etch at least partially through said aluminum-containing layer.

21. The method of claim 20 wherein said oxygen-containing source gas is $CO_2$.

22. The method of claim 21 wherein said chlorine-containing source gas is $Cl_2$.

23. The method claim 22 wherein said plasma processing chamber is an inductively coupled plasma processing chamber.

24. The method of claim 23 wherein said plasma is a low pressure high density plasma.

25. The method of claim 24 wherein said etchant source gas is substantially free of $BCl_3$.

26. The method of claim 20 wherein said oxygen-containing source gas is a mixture of $CO_2$ and He.

* * * * *